US012068169B2

(12) United States Patent
Cui et al.

(10) Patent No.: US 12,068,169 B2
(45) Date of Patent: Aug. 20, 2024

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Ji Cui, Bolingbrook, IL (US); Chih Hung Chen, Hsinchu (TW); Liang-Guang Chen, Hsinchu (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 45 days.

(21) Appl. No.: 17/446,248

(22) Filed: Aug. 27, 2021

(65) Prior Publication Data

US 2022/0310404 A1    Sep. 29, 2022

Related U.S. Application Data

(60) Provisional application No. 63/166,067, filed on Mar. 25, 2021.

(51) Int. Cl.
*H01L 21/321* (2006.01)
*H01L 21/67* (2006.01)
*H01L 21/768* (2006.01)

(52) U.S. Cl.
CPC .... *H01L 21/3212* (2013.01); *H01L 21/67046* (2013.01); *H01L 21/67051* (2013.01); *H01L 21/76814* (2013.01)

(58) Field of Classification Search
CPC ........... H01L 21/3212; H01L 21/67046; H01L 21/67051; H01L 21/76814; H01L 21/02074; H01L 21/6719; H01L 21/67219; H01L 21/30625; H01L 21/67017; B08B 5/00
See application file for complete search history.

(56) References Cited

U.S. PATENT DOCUMENTS 6,315,858 B1 * 11/2001 Shinozuka ................ C23F 3/00
156/345.39
6,410,440 B1 * 6/2002 Drill .................... H01L 21/3212
438/692

(Continued)

*Primary Examiner* — Duy Vu N Deo
*Assistant Examiner* — Christopher Remavege
(74) *Attorney, Agent, or Firm* — Harrity & Harrity, LLP

(57) ABSTRACT

A semiconductor processing tool includes a cleaning chamber configured to perform a post-chemical mechanical polishing/planarization (post-CMP) cleaning operation in an oxygen-free (or in a near oxygen-free) manner. An inert gas may be provided into the cleaning chamber to remove oxygen from the cleaning chamber such that the post-CMP cleaning operation may be performed in an oxygen-free (or in a near oxygen-free) environment. In this way, the post-CMP cleaning operation may be performed in an environment that may reduce oxygen-causing corrosion of metallization layers and/or metallization structures on and/or in the semiconductor wafer, which may increase semiconductor processing yield, may decrease semiconductor processing defects, and/or may increase semiconductor processing quality, among other examples.

20 Claims, 13 Drawing Sheets

(56) References Cited

U.S. PATENT DOCUMENTS

| | | | |
|---|---|---|---|
| 6,494,220 B1* | 12/2002 | Matsuda | H01L 21/67051 134/182 |
| 9,460,945 B2* | 10/2016 | Nakada | H01L 21/67109 |
| 10,832,917 B2* | 11/2020 | Canaperi | B08B 3/10 |
| 11,189,511 B2* | 11/2021 | Reuter | H01L 21/67769 |
| 11,244,844 B2* | 2/2022 | Reuter | H01L 21/67167 |
| 2001/0043989 A1* | 11/2001 | Akimoto | H01L 21/67184 156/345.31 |
| 2002/0036004 A1* | 3/2002 | Shih | B08B 3/02 134/36 |
| 2003/0136512 A1* | 7/2003 | Yamamoto | G03F 9/7096 430/5 |
| 2003/0137052 A1* | 7/2003 | Horiuchi | H01L 21/3212 257/E21.582 |
| 2004/0009670 A1* | 1/2004 | Preusse | H01L 21/3212 438/692 |
| 2004/0086430 A1* | 5/2004 | Mayeda | H01L 21/67017 422/120 |
| 2004/0142564 A1* | 7/2004 | Mullee | C11D 11/0047 438/689 |
| 2010/0175781 A1* | 7/2010 | Kisakibaru | H01L 21/67396 141/286 |
| 2012/0131815 A1* | 5/2012 | Kraus | H01L 21/67051 34/239 |
| 2014/0026926 A1* | 1/2014 | Semmelrock | H01L 21/67051 134/30 |
| 2016/0296984 A1* | 10/2016 | Murata | H01L 21/67389 |
| 2017/0178918 A1* | 6/2017 | Gyulai | H01L 21/02065 |
| 2018/0174868 A1* | 6/2018 | Sugihara | B08B 1/04 |
| 2018/0358230 A1* | 12/2018 | Canaperi | H01L 21/02057 |
| 2018/0358239 A1* | 12/2018 | Senn | H01L 21/67017 |
| 2019/0206708 A1* | 7/2019 | Woo | H01L 21/67393 |
| 2021/0134605 A1* | 5/2021 | Nakayama | H01L 21/67103 |

\* cited by examiner

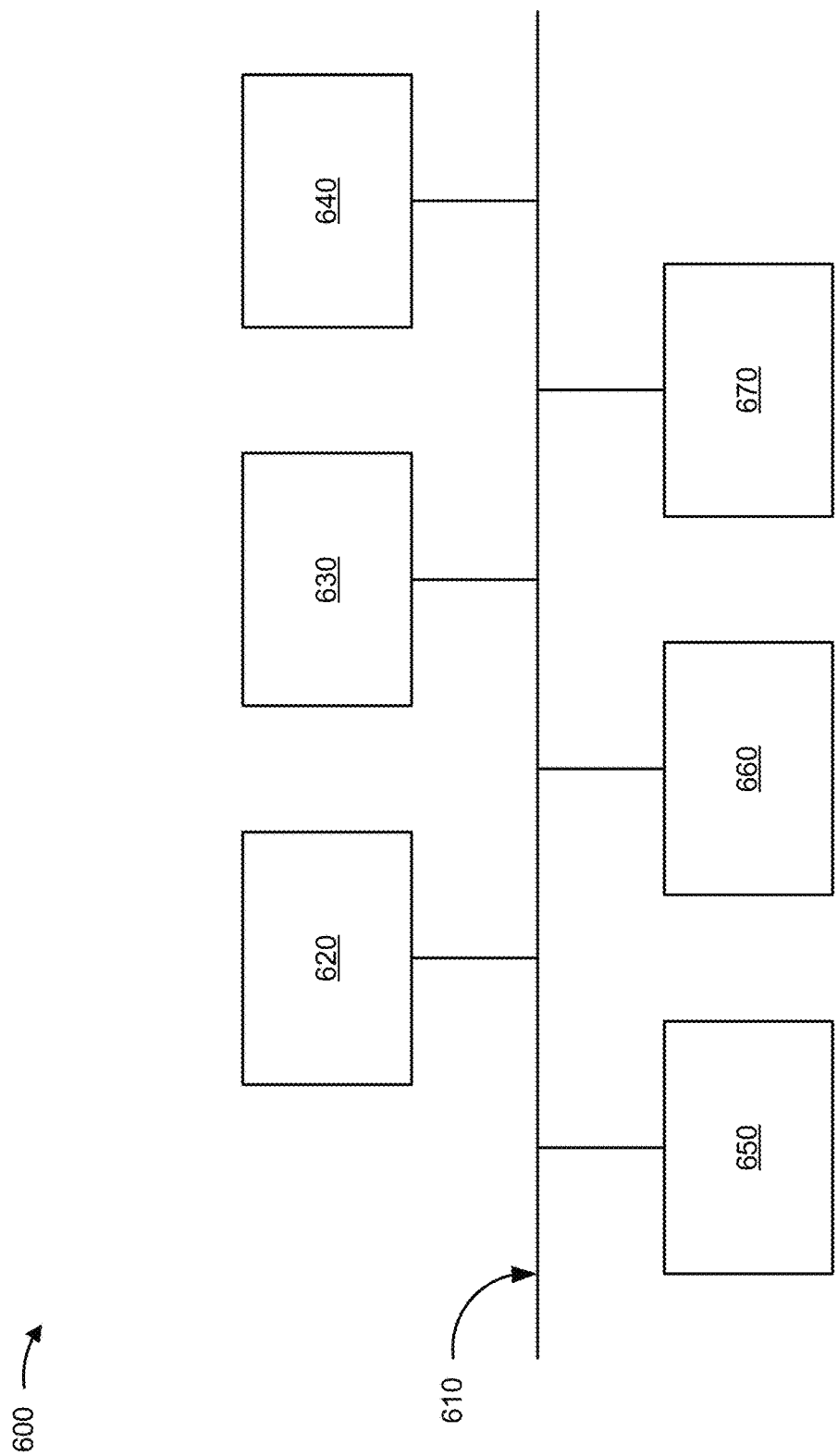

SEMICONDUCTOR PROCESSING TOOL AND METHODS OF OPERATION

CROSS-REFERENCE TO RELATED APPLICATION

This patent application claims priority to U.S. Provisional Patent Application No. 63/166,067, filed on Mar. 25, 2021, and entitled "SEMICONDUCTOR PROCESSING TOOL AND METHODS OF OPERATION." The disclosure of the prior application is considered part of and is incorporated by reference into this patent application.

BACKGROUND

A layer, a substrate, or a semiconductor wafer may be planarized using a polishing or planarizing technique such as chemical mechanical polishing/planarization (CMP). A CMP process may include depositing a slurry (or polishing compound) onto a polishing pad. A semiconductor wafer may be mounted to a carrier, which may rotate the semiconductor wafer as the semiconductor wafer is pressed against the polishing pad. The slurry and polishing pad act as an abrasive that polishes or planarizes one or more layers (e.g., metallization layers) of the semiconductor wafer as the semiconductor wafer is rotated. The polishing pad may also be rotated to ensure a continuous supply of slurry is applied to the polishing pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a diagram of example components of one or more devices of FIG. 1.

DETAILED DESCRIPTION

Figure 1:
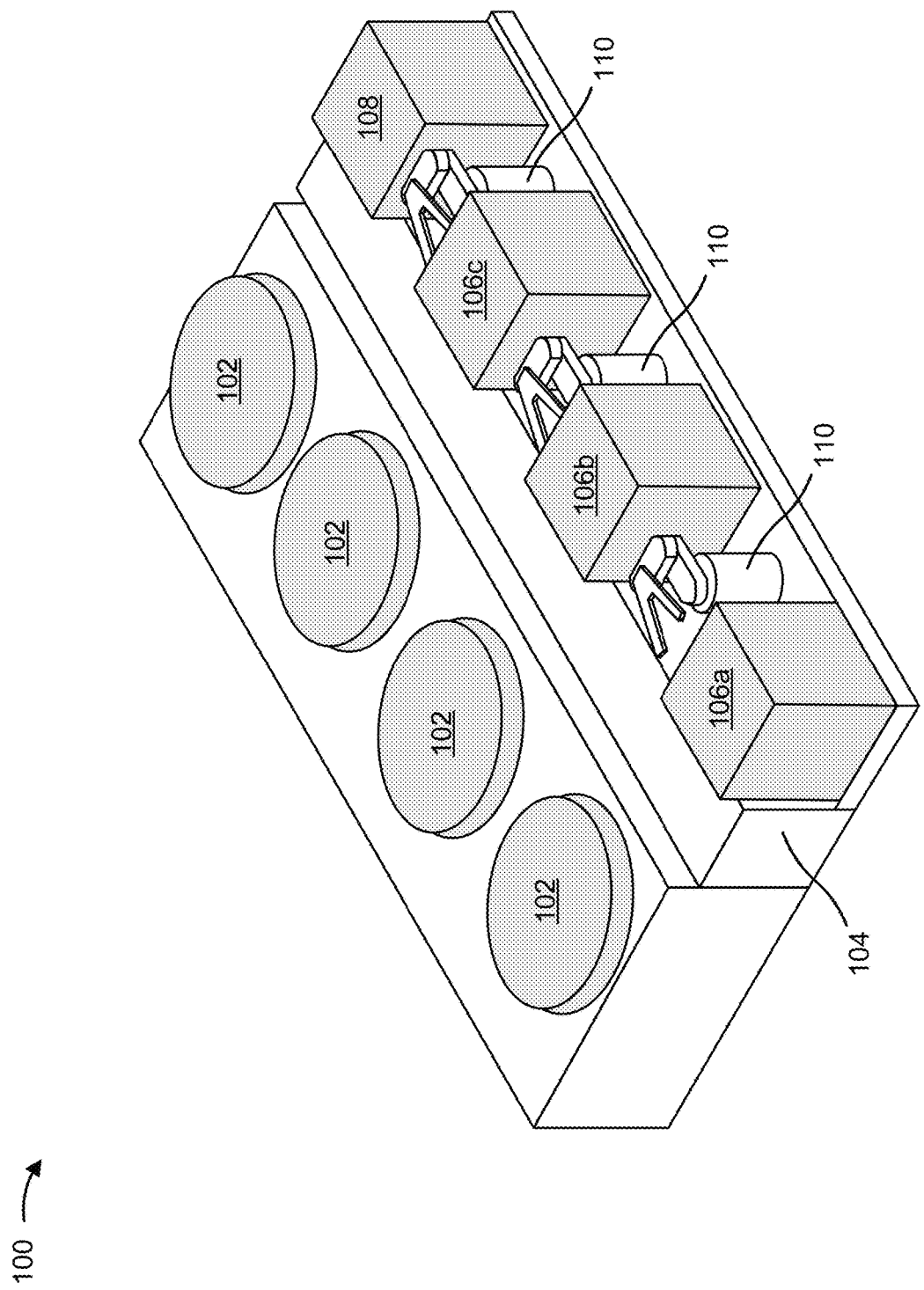
FIG. 1 is a diagram of an example chemical mechanical polishing/planarization (CMP) tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor substrate may be cleaned after a chemical mechanical polishing/planarization (CMP) operation in one or more post-CMP cleaning operations. To perform a post-CMP cleaning operation, a semiconductor substrate may be placed in a cleaning chamber (e.g., of a planarization tool such as a CMP tool) and cleaned using various cleaning agents and various rinsing agents. A post-CMP cleaning operation may result in corrosion of the semiconductor substrate due to atmospheric oxygen in the cleaning chamber, oxygen in the rinsing agent, oxygen in the cleaning agent, and/or oxygen from other sources in the cleaning chamber.

Some implementations described herein provide a semiconductor processing tool that includes a cleaning chamber configured to perform a post-CMP cleaning operation in an oxygen-free (or in a near oxygen-free) manner. An inert gas may be provided into the cleaning chamber to purge or remove oxygen from the cleaning chamber such that the post-CMP cleaning operation may be performed in an oxygen-free (or in a near oxygen-free) environment. In this way, the post-CMP cleaning operation may be performed in an environment that reduces oxygen-causing corrosion of metallization layers and/or metallization structures on and/or in the semiconductor wafer, which may increase semiconductor processing yield, may decrease semiconductor processing defects, and/or may increase semiconductor processing quality, among other examples.

FIG. 1 is a diagram of an example CMP tool 100 described herein. The CMP tool 100 includes a semiconductor processing tool that is capable of polishing or planarizing a semiconductor wafer, a semiconductor device, and/or another type of semiconductor substrate. The CMP tool 100 includes one or more processing chambers 102 in which layers and/or structures of a semiconductor wafer are polished or planarized. In some implementations, a processing chamber 102 is configured to polish or planarize a surface (or a layer or structure) of a semiconductor wafer with a combination of chemical and mechanical forces (e.g., chemical etching and free abrasive polishing). The CMP tool 100 is configured to utilize an abrasive and corrosive chemical slurry in conjunction with a polishing pad and retaining ring (e.g., typically of a greater diameter than the semiconductor wafer) in a processing chamber 102. To perform a CMP operation, the CMP tool 100 presses the polishing pad against the semiconductor wafer in the processing chamber 102 using a dynamic polishing head that is held in place by the retaining ring. The dynamic polishing head may rotate with different axes of rotation to remove material and even out any irregular topography of a layer or a structure of the semiconductor wafer, thereby making the layer or a structure of the semiconductor wafer flat or planar.

The CMP tool 100 includes a transfer chamber 104 in which semiconductor wafers are transferred to and from the processing chamber(s) 102. Moreover, semiconductor wafers are transferred between the transfer chamber 104 and one or more cleaning chambers 106 included in the CMP tool 100. A cleaning chamber 106 (also referred to as a CMP cleaning chamber or a post-CMP cleaning chamber) is a component of the CMP tool 100 that is configured to perform a post-CMP cleaning operation to clean or remove residual slurry and/or removed material from a semiconductor wafer that has undergone a CMP operation. In some implementations, the CMP tool 100 includes a plurality of cleaning chambers 106, and the CMP tool 100 is configured to process a semiconductor wafer through a plurality of sequential post-CMP cleaning operations in the plurality of cleaning chambers 106. As an example, the CMP tool 100 may process a semiconductor wafer in a first post-CMP cleaning operation in a cleaning chamber 106a, may process the semiconductor wafer in a second post-CMP cleaning operation in a cleaning chamber 106b, may process the semiconductor wafer in a third post-CMP cleaning operation in a cleaning chamber 106c, and so on.

A cleaning chamber 106 cleans a semiconductor wafer using a cleaning agent such as isopropyl alcohol (IPA), a chemical solution that includes a plurality of cleaning chemicals, and/or another type of cleaning agent. The CMP tool 100 includes one or more types of cleaning chambers 106. Each type of cleaning chamber 106 is configured to clean a semiconductor wafer using a different type of cleaning device. In some implementations, a cleaning chamber 106 includes a brush-type cleaning chamber. A brush-type cleaning chamber is a cleaning chamber that includes one or more cleaning brushes (or roller brushes) that are configured to spin or rotate to brush-clean a semiconductor wafer. In some implementations, a cleaning chamber 106 includes a pen-type cleaning chamber. A pen-type cleaning chamber is a cleaning chamber that includes a cleaning pen (or cleaning pencil) that is configured to provide fine-tuned and detailed cleaning of a semiconductor substrate.

In some implementations, the cleaning chambers 106 of the CMP tool 100 are arranged such that a semiconductor wafer is first processed in one or more brush-type cleaning chambers (e.g., to remove a large amount of removed material and residual slurry from the semiconductor wafer), and is then processed in a pen-type cleaning chamber (e.g., to provide detailed cleaning of structures and/or recesses in the semiconductor wafer). As an example, the cleaning chambers 106a and 106b may be configured as brush-type cleaning chambers, and cleaning chamber 106c may be configured as a pen-type cleaning chamber.

The CMP tool 100 includes a rinsing chamber 108 that is configured to rinse a semiconductor wafer after one or more post-CMP cleaning operations. The rinsing chamber 108 rinses a semiconductor wafer to remove residual cleaning agent from the semiconductor wafer. The rinsing chamber 108 is configured to use a rinsing agent, such as deionized water (DIW) or another type of rinsing agent, to rinse a semiconductor wafer. Semiconductor wafers are transferred to the rinsing chamber 108 from a cleaning chamber 106 directly or through the transfer chamber 104. In some implementations, a semiconductor wafer is processed in a drying operation in the rinsing chamber 108, in which the semiconductor wafer is dried to prevent oxidation and/or other types of contamination o the semiconductor wafer.

The CMP tool 100 includes a plurality of transport devices 110. The transport devices 110 include robot arms or other types of transport devices that are configured to transfer semiconductor wafers between the processing chamber(s) 102, the transfer chamber 104, the cleaning chamber(s) 106, and/or the rinsing chamber 108.

As indicated above, FIG. 1 is provided as an example. Other examples may differ from what is described with regard to FIG. 1.

Figure 2:
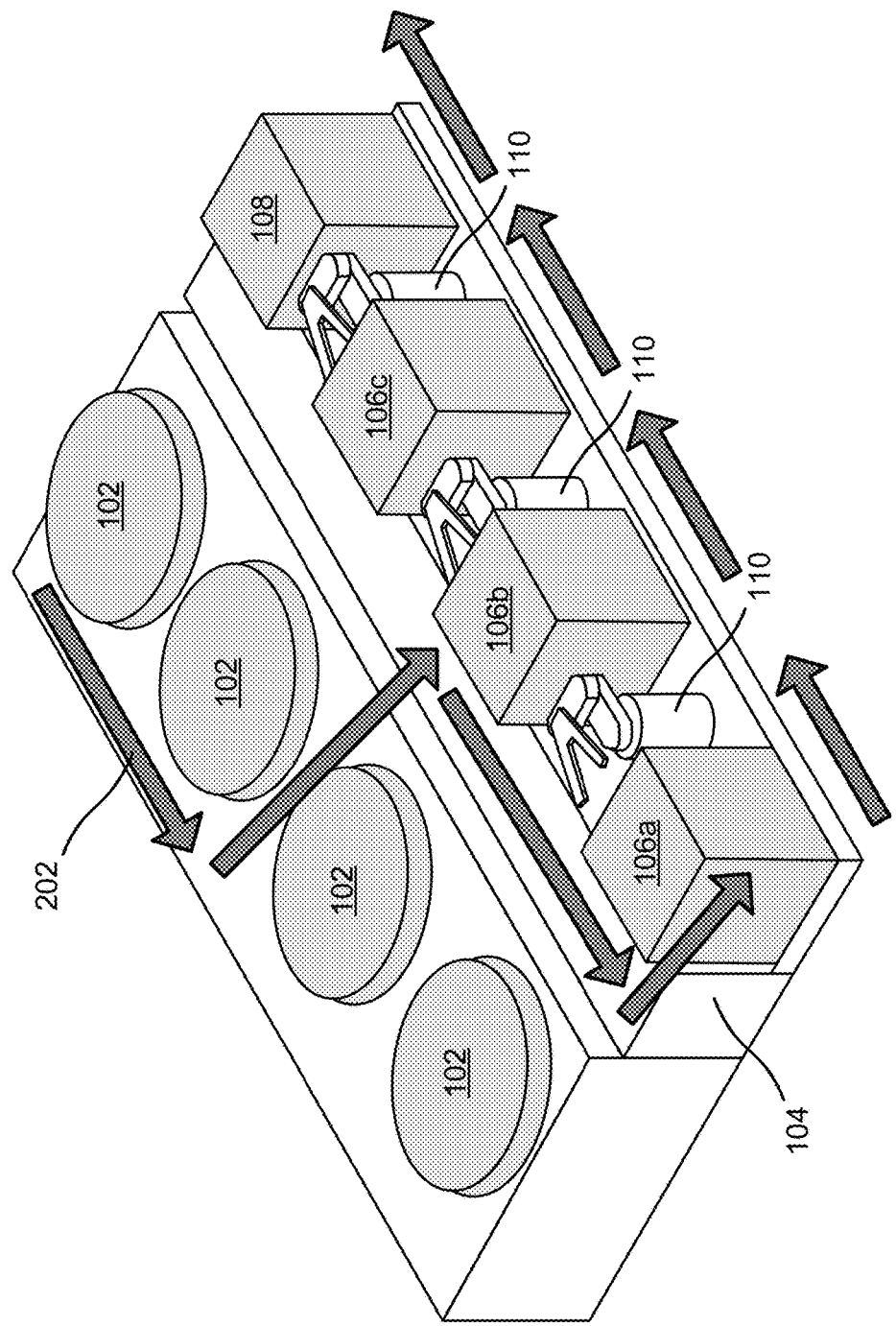
FIG. 2 is a diagram of an example implementation described herein.

FIG. 2 is a diagram of an example implementation 200 described herein. The example implementation 200 includes an example of a process flow path 202 for processing a semiconductor wafer through the CMP tool 100. As shown in FIG. 2, the process flow path 202 includes processing the semiconductor wafer in one or more CMP operations in one or more processing chambers 102. After completion of the one or more CMP operations, the semiconductor wafer is transferred from a processing chamber 102 to the transfer chamber 104. The semiconductor wafer travels through the transfer chamber 104 and is then transferred from the transfer chamber 104 to the cleaning chamber 106a.

The semiconductor wafer is processed in a post-CMP cleaning operation in the cleaning chamber 106a. A transport device 110 transfers the semiconductor wafer from the cleaning chamber 106a to the cleaning chamber 106b. The semiconductor wafer is processed in a post-CMP cleaning operation in the cleaning chamber 106b. A transport device 110 transfers the semiconductor wafer from the cleaning chamber 106b to the cleaning chamber 106c. The semiconductor wafer is processed in a post-CMP cleaning operation in the cleaning chamber 106c. A transport device 110 transfers the semiconductor wafer from the cleaning chamber 106c to the rinsing chamber 108. The semiconductor wafer is processed in a rinsing operation and/or a drying operation in the rinsing chamber 108. The semiconductor wafer may then be transferred to a transport carrier for storage or to another semiconductor tool for further processing.

As indicated above, FIG. 2 is provided as an example. Other examples may differ from what is described with regard to FIG. 2.

Figure 3:
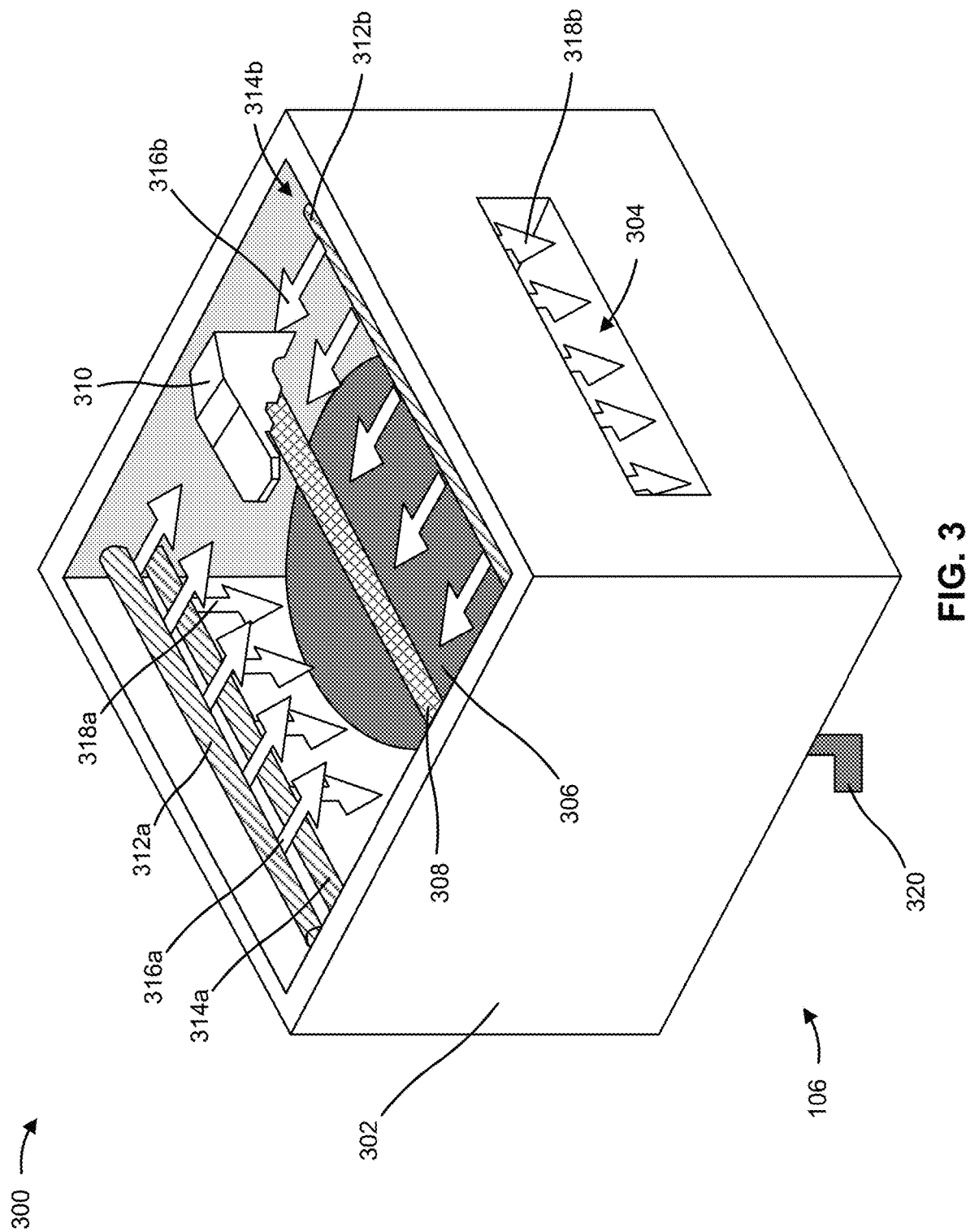
FIGS. 3, 4A, and 4B are diagrams of example implementations of cleaning chambers described herein.

FIG. 3 is a diagram of an example implementation 300 of a cleaning chamber 106 described herein. The cleaning chamber 106 described in connection with FIG. 3 is an example of a brush-type cleaning chamber that includes one or more nozzles configured to provide an inert gas into the cleaning chamber 106 to purge or remove oxygen from the cleaning chamber 106.

As shown in FIG. 3, the cleaning chamber 106 includes an enclosure 302. The enclosure 302 includes an opening 304 through which a semiconductor wafer may be transferred to and/or from the cleaning chamber 106 (e.g., by a transport device 110). In some implementations, the enclosure 302 is configured to be hermetically sealed such that the environment in the enclosure 302 may be controlled to reduce or minimize oxygen ingress and ingress of other types of contaminants.

The cleaning chamber 106 includes a wafer stage 306 in the enclosure 302. The wafer stage 306 includes a chuck, a platen, or another type of component that is configured to support a semiconductor wafer. In some implementations, the wafer stage 306 is configured to rotate such that a semiconductor wafer positioned on the wafer stage 306 is rotated (e.g., during a post-CMP cleaning operation).

The cleaning chamber 106 includes a cleaning brush 308 configured to mechanically or physically rotate against a semiconductor wafer positioned on the wafer stage 306. In some implementations, the cleaning brush 308 is configured to be raised and lowered to permit semiconductor wafers to be transferred to and/or from the wafer stage 306. A nozzle 310 is included to dispense a cleaning agent to a semiconductor wafer that is positioned on the wafer stage 306.

As further shown in FIG. 3, the cleaning chamber 106 includes one or more nozzles configured to provide an inert gas into the cleaning chamber 106 to purge or remove oxygen from the cleaning chamber 106. The inert gas includes argon (Ar), nitrogen (N$_2$), helium (He), and/or another inert gas. In some implementations, the cleaning chamber 106 includes a single nozzle that is configured to dispense the inert gas into the cleaning chamber 106.

In some implementations, the cleaning chamber 106 includes a plurality of nozzles that are configured to dispense the inert gas into the cleaning chamber 106 to increase the flow rate of the inert gas into the chamber, to increase the distribution uniformity of the inert gas into the cleaning chamber 106, and/or to decrease the time duration for removing oxygen from the cleaning chamber 106, among other examples. In some implementations, the cleaning chamber 106 includes nozzles 312a and 314a at or near a first side of the cleaning chamber 106, and nozzles 312b and 314b at or near a second side of the cleaning chamber 106. In some implementations, the first side and the second side are opposing sides of the cleaning chamber 106. In some implementations, the first side and the second side are adjacent sides of the cleaning chamber 106.

In some implementations, the cleaning chamber 106 includes nozzles that are configured to provide inert gas into the cleaning chamber 106 at different angles and/or in different directions to increase the distribution uniformity of the inert gas into the cleaning chamber 106. As shown in FIG. 3, a first subset of the nozzles (e.g., the nozzles 312a and 312b) are configured to provide an approximately horizontal flow 316a and 316b, respectively, of inert gas into the cleaning chamber 106. A second subset of the nozzles (e.g., the nozzles 314a and 314b) are configured to provide an approximately downward or approximately vertical flow 318a and 318b, respectively, of inert gas into the cleaning chamber 106. However, the nozzles, 312a, 312b, 314a, and/or 314b may be configured to provide inert gas at diagonal or angular directions. Moreover, a nozzle may be configured to provide inert gas at a plurality of angles or directions into the cleaning chamber 106.

Oxygen is removed from the cleaning chamber 106 through a vent 320 in the enclosure 302. The vent 320 may be located at an opposing side of the cleaning chamber 106 relative to the location(s) of the nozzles 312a, 312b, 314a, and/or 314b such that the inert gas is permitted to flow through the cleaning chamber 106 to the vent 320 to purge or remove oxygen from the cleaning chamber 106. In some implementations, the nozzles 312a, 312b, 314a, and 314b are located at or near a top of the cleaning chamber 106, and the vent 320 is located at or near a bottom of the cleaning chamber 106. In some implementations, the nozzles 312a, 312b, 314a, and 314b are located at or near a bottom of the cleaning chamber 106, and the vent 320 is located at or near a top of the cleaning chamber 106.

As indicated above, FIG. 3 is provided as an example. Other examples may differ from what is described with regard to FIG. 3.

Figure 4A:
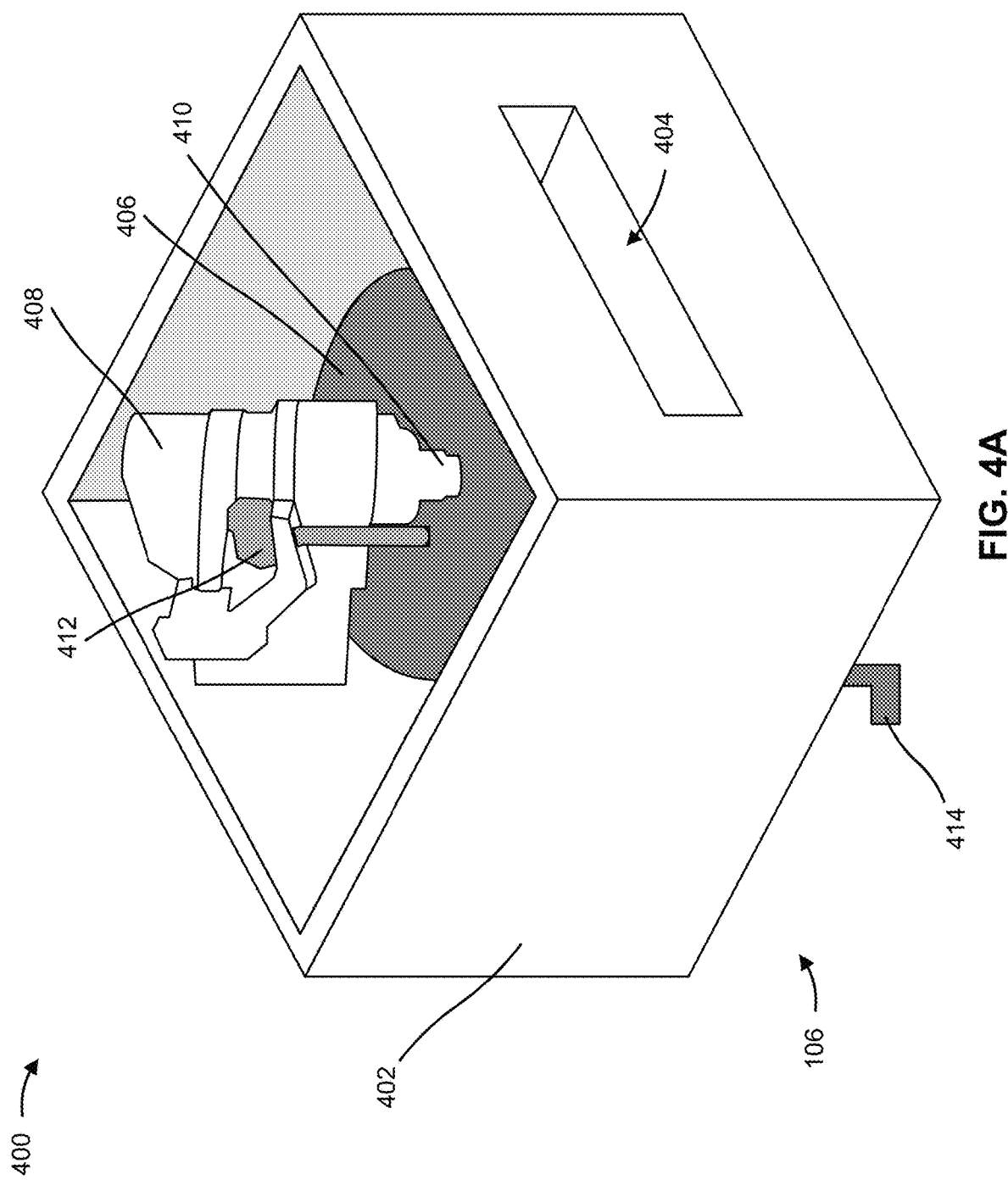
Figure 4B:
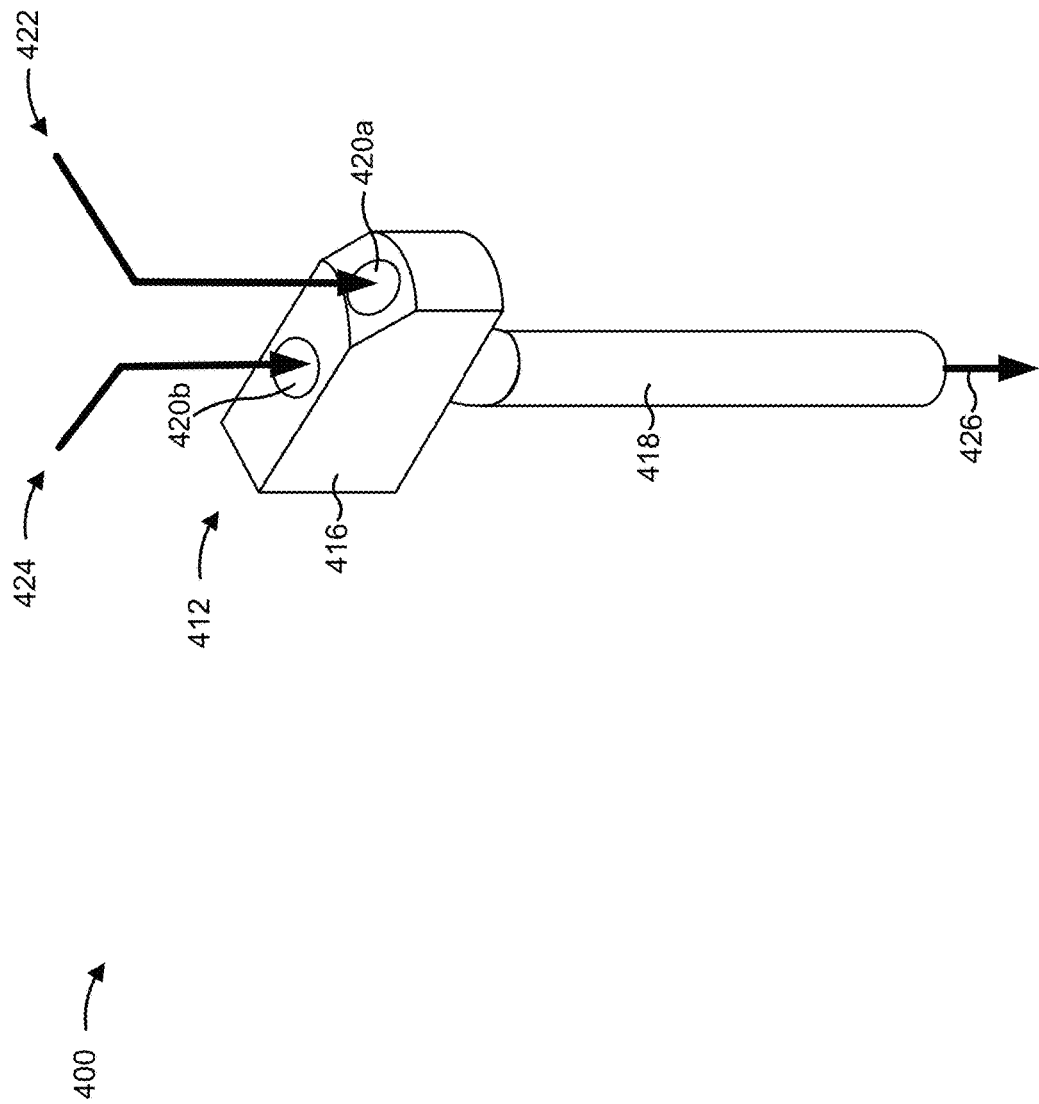

FIGS. 4A and 4B are diagrams of an example implementation 400 of another cleaning chamber 106 described herein. The cleaning chamber 106 described in connection with FIGS. 4A and 4B is an example of a pen-type cleaning chamber that includes one or more nozzles configured to provide an inert gas into the cleaning chamber 106 to purge or remove oxygen from the cleaning chamber 106.

As shown in FIG. 4A, the cleaning chamber 106 includes an enclosure 402. The enclosure 402 includes an opening 404 through which a semiconductor wafer may be transferred to and/or from the cleaning chamber 106 (e.g., by a transport device 110). In some implementations, the enclosure 402 is configured to be hermetically sealed such that the environment in the enclosure 402 may be controlled to reduce or minimize oxygen ingress and ingress of other types of contaminants.

The cleaning chamber 106 includes a wafer stage 406 in the enclosure 402. The wafer stage 406 includes a chuck, a platen, or another type of component that is configured to support a semiconductor wafer. In some implementations, the wafer stage 406 is configured to rotate such that a semiconductor wafer positioned on the wafer stage 406 is rotated (e.g., during a post-CMP cleaning operation) such that the semiconductor wafer is cleaned while rotating.

The cleaning chamber 106 includes a cleaning head 408. In some implementations, the cleaning head 408 is configured to be raised and lowered to permit semiconductor wafers to be transferred to and/or from the wafer stage 406. The cleaning head 408 includes a cleaning pen 410 that is configured to mechanically or physically clean a semiconductor wafer positioned on the wafer stage 406. Moreover, the cleaning head 408 includes a nozzle 412 that is configured to dispense a cleaning agent onto a semiconductor wafer that is positioned on the wafer stage 406. The nozzle 412 is further configured to provide an inert gas into the cleaning chamber 106 to purge or remove oxygen from the cleaning chamber 106. In this way, the inert gas and the cleaning agent is permitted to be provided through a single nozzle (e.g., concurrently or sequentially) which increases the performance of the cleaning chamber 106 without increasing the complexity of the cleaning chamber 106. Oxygen is removed from the cleaning chamber 106 through a vent 414 in the enclosure 402.

FIG. 4B illustrates various details of the nozzle 412. As shown in FIG. 4B, the nozzle 412 includes a head 416 and an elongated body 418. The head 416 includes a plurality of inlets 420, including an inlet 420a through which a supply of a cleaning agent 422 is provided to the nozzle 412 and an inlet 420b through which a supply of an inert gas 424 is provide to the nozzle 412. The cleaning agent 422 and/or the inert gas 424 flows through the head 416, through the elongated body 418, and out of the nozzle 412 through an opening 426 into the cleaning chamber 106. The elongated body 418 may be elongated to reduce turbulence in the flow of the cleaning agent 422 and/or the inert gas 424 through the nozzle 412.

As indicated above, FIGS. 4A and 4B are provided as an example. Other examples may differ from what is described with regard to FIGS. 4A and 4B.

FIGS. 5A-5E are diagrams of an example implementation 500 described herein. The example implementation 500 includes an example in which a semiconductor wafer 502 including one or more metallization layers 504 is processed by the CMP tool 100.

In some implementations, the semiconductor wafer 502 is formed of silicon (Si) (e.g., a silicon substrate), a material including silicon, a III-V compound semiconductor material such as gallium arsenide (GaAs), a silicon on insulator (SOI), or another type of semiconductor material. In some implementations, the semiconductor wafer 502 is formed of a doped material (e.g., a p-doped material or an n-doped material) such as a doped silicon.

The one or more metallization layers 504 include a metal layer formed on the semiconductor wafer 502, a metal layer (e.g., a plug, an interconnect, a via) formed in an opening or recess in the semiconductor wafer (or in another layer on the semiconductor wafer), and/or another type of metal structure. The one or more metallization layers 504 include one or more metallic materials such as ruthenium (Ru), cobalt (Co), copper (Cu), gold (Ag), aluminum (Al), silver (Ag), tungsten (W), molybdenum (Mo), a metal alloy, and/or another type of metallic material. In some implementations, the thickness of the one or more metallization layers 504 are in a range of approximately 20 angstroms to approximately 20,000 angstroms. However, other values for the thickness of the one or more metallization layers 504 are within the scope of the present disclosure. In some implementations, the area metal density of the one or more metallization layers 504 is greater than 1%. However, other values for the area metal density are within the scope of the present disclosure.

Figure 5A:
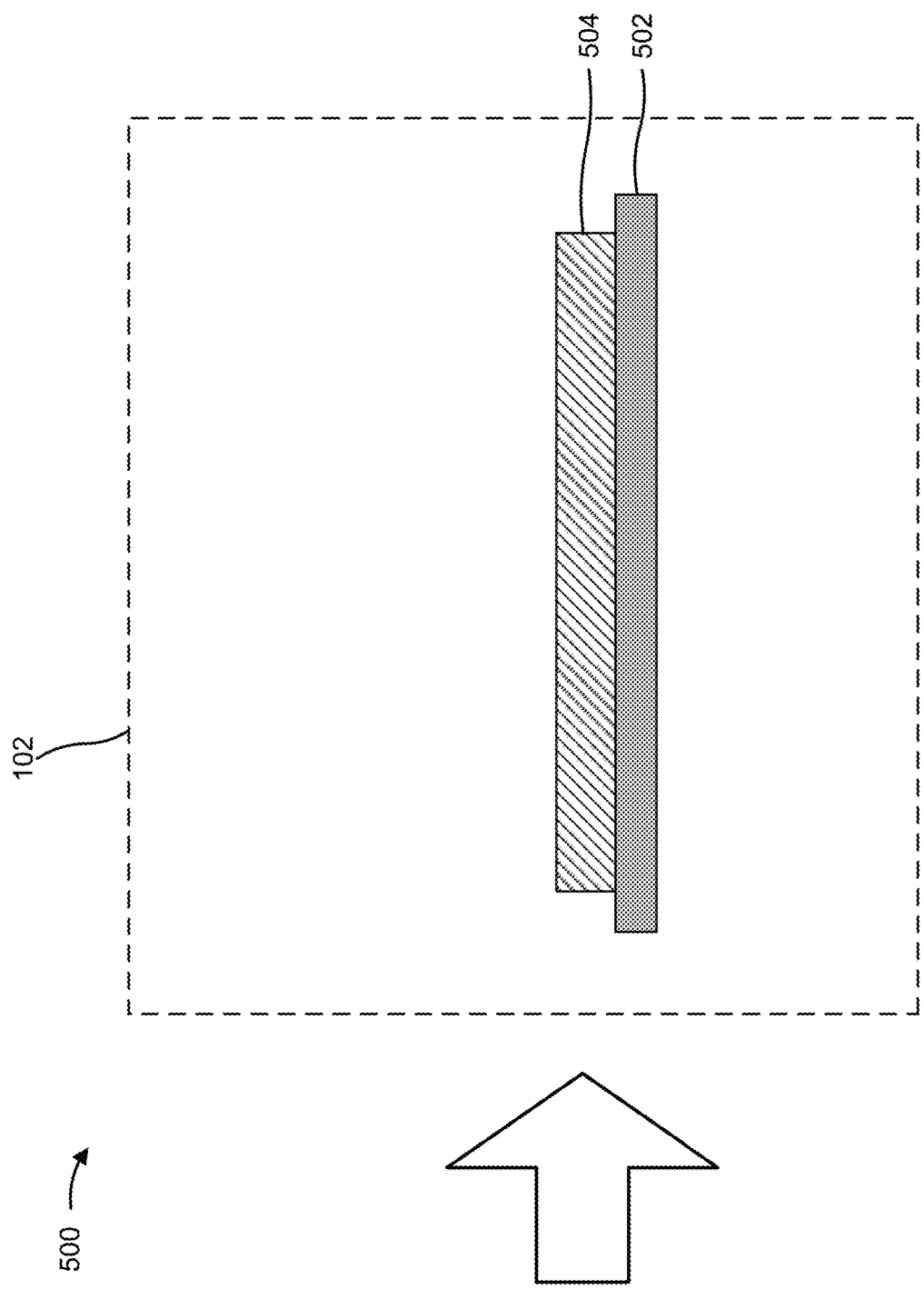
FIGS. 5A-5E are diagrams of an example implementation described herein.

As shown in FIG. 5A, the semiconductor wafer 502 is placed or positioned in a processing chamber 102 of the CMP tool 100. In some implementations, a transport device 110 transfers the semiconductor wafer 502 to the processing chamber 102 from the transfer chamber 104.

Figure 5B:
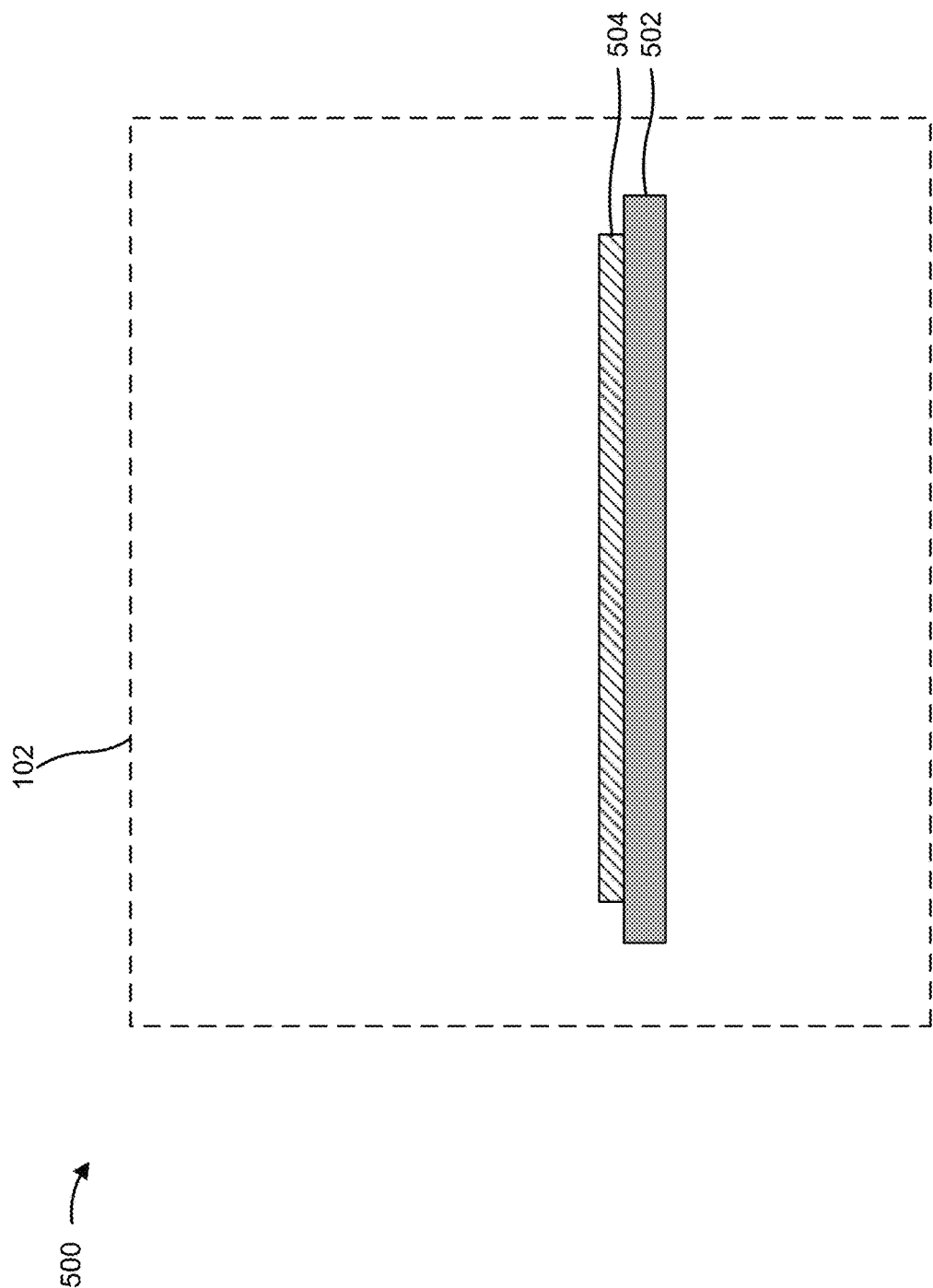

As shown in FIG. 5B, the one or more metallization layers 504 are polished or planarized in a CMP operation in the processing chamber 102. The one or more metallization layer(s) 504 are polished or planarized to flatten the one or more metallization layers 504, to remove excess material from the one or more metallization layers 504, to reduce the thickness of the one or more metallization layers 504, and/or for another purpose. In some implementations, at least approximately 10 angstroms of material are removed from the one or more metallization layers 504 in the CMP operation. However, other values for the amount of material that is removed from the one or more metallization layers 504 are within the scope of the present disclosure.

Figure 5C:
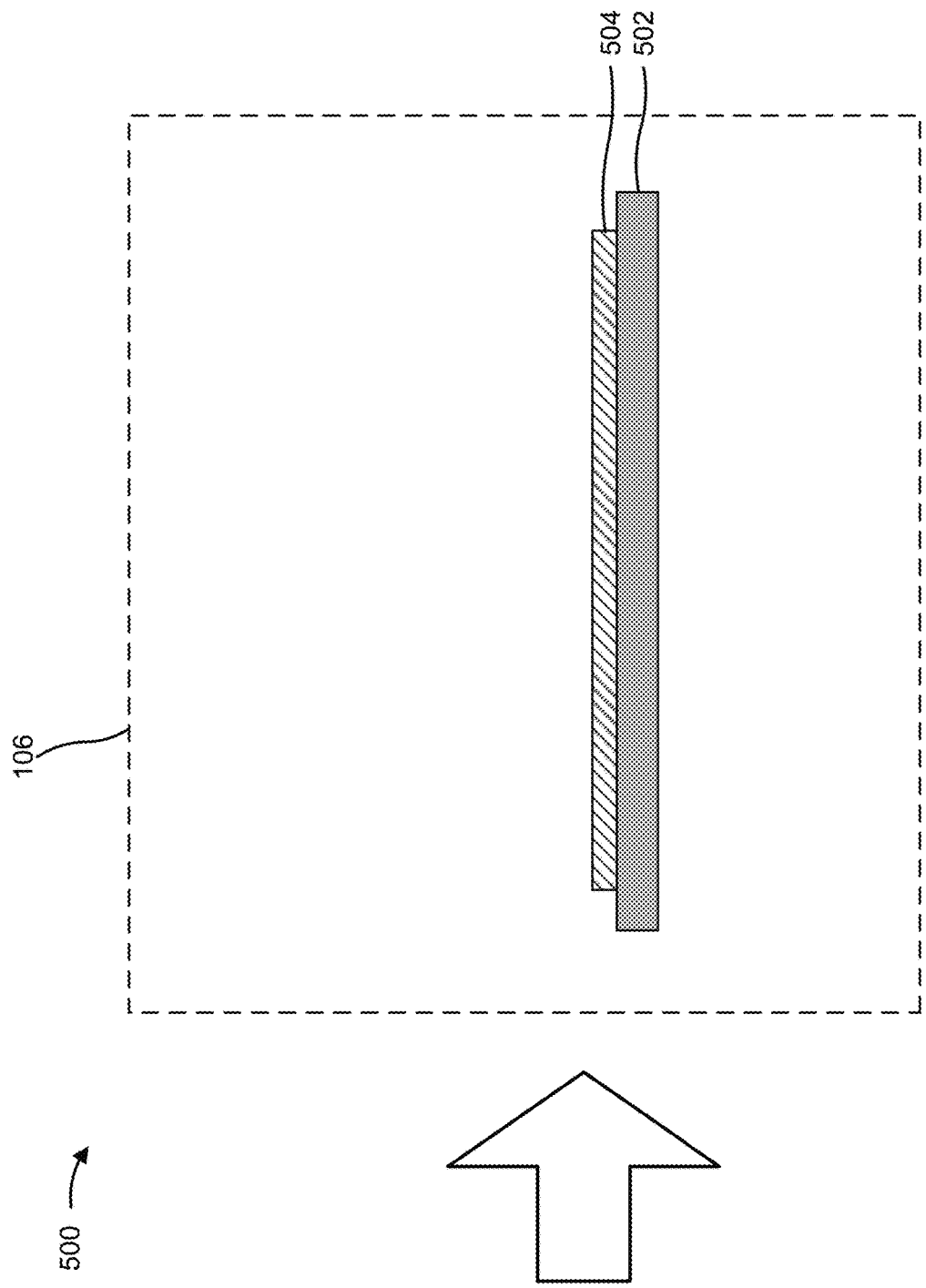

As shown in FIG. 5C, the semiconductor wafer 502 is transferred to a cleaning chamber 106 of the CMP tool 100. In some implementations, a transport device 110 transfers the semiconductor wafer 502 to the cleaning chamber 106 from the transfer chamber 104. In some implementations, a transport device 110 transfers the semiconductor wafer 502 from the processing chamber 102 to the transfer chamber 104, and then from the transfer chamber 104 to the cleaning chamber 106 after the CMP operation.

Figure 5D:
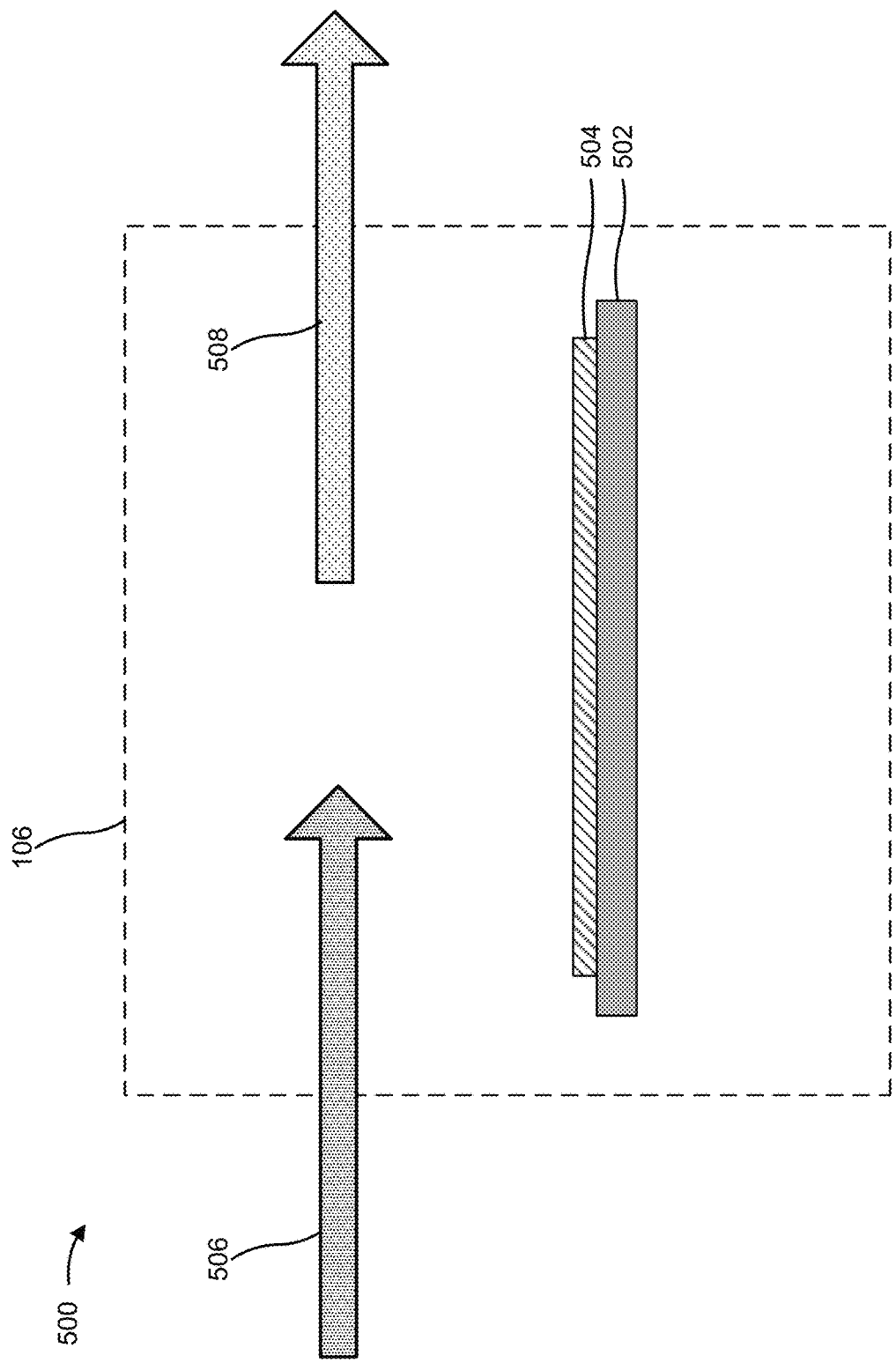

As shown in FIG. 5D, an inert gas 506 is provided into the cleaning chamber 106 to remove oxygen 508 from the cleaning chamber 106. The inert gas 506 is provided into the cleaning chamber 106 through one or more nozzles (e.g., the nozzle 312a, 312b, 314a, 314b, and/or 412) in the cleaning chamber 106. The inert gas 506 is provided into the cleaning chamber such that approximately 90% to approximately 100% of the oxygen 508 is removed from the cleaning chamber 106 to reduce and/or minimize the likelihood of oxidation of the one or more metallization layers 504. However, other values for the inert gas 506 concentration are within the scope of the present disclosure. The inert gas 506 is provided into the cleaning chamber 106 while the oxygen 508 is removed or vented out of the cleaning chamber 106 through a vent (e.g., the vent 320, the vent 414). In this way, an amount of the inert gas 506 is provided into the cleaning chamber 106 such that the environment in the cleaning chamber 106 is controlled to include approximately 0% to approximately 10% oxygen. This permits the semiconductor wafer 502 to be cleaned in an oxygen-free (or near oxygen-free) environment in the cleaning chamber 106 to reduce and/or minimize the likelihood of oxidation of the one or more metallization layers 504.

In some implementations, the inert gas 506 is provided into the cleaning chamber 106 at a particular flow rate (or within a flow rate range) to remove a sufficient amount of the oxygen 508 from the cleaning chamber 106. As an example, the inert gas 506 may be provided into the cleaning chamber 106 at a flow rate that is in a range of approximately 500 standard cubic centimeters per minute (sccm) to approximately 50000 sccm to reduce the concentration of the oxygen 508 in the cleaning chamber 106 to a range of approximately 0% to approximately 10%. However, other values for the flow rate are within the scope of the present disclosure.

In some implementations, a controller (e.g., the device 600 described in connection with FIG. 6) associated with the cleaning chamber 106 causes the inert gas 506 to be provided into the cleaning chamber 106 based on or in response to the semiconductor wafer 502 being transferred into the cleaning chamber 106. In some implementations, the controller causes the inert gas 506 to be provided into the cleaning chamber 106 prior to the semiconductor wafer 502 being transferred into the cleaning chamber 106. In this way, the controller causes the cleaning chamber 106 to be "pre-purged" such that the oxygen 508 is removed from the cleaning chamber 106 prior to the semiconductor wafer 502 being placed in the cleaning chamber 106, which further reduces the exposure of the semiconductor wafer 502 to the oxygen 508. In these implementations, the controller may further cause the inert gas 506 to be provided into the cleaning chamber 106 after the semiconductor wafer 502 is provided into the cleaning chamber 106 to remove any oxygen 508 that may have entered the cleaning chamber 106 as a result of opening the cleaning chamber 106 to transfer the semiconductor wafer 502 into the cleaning chamber 106.

In some implementations, the controller may cause the inert gas 506 to be provided into the cleaning chamber 106 a particular time duration prior to a time at which the semiconductor wafer 502 is transferred into the cleaning chamber 106. In this way, the cleaning chamber 106 is "pre-purged" a sufficient time duration before the semiconductor wafer 502 is transferred into the cleaning chamber 106 to fully purge the cleaning chamber 106 of the oxygen 508. The controller may determine the duration (or the starting time) of the time duration based on various factors, such as the estimated time at which the semiconductor wafer 502 is to be transferred into the cleaning chamber 106, based on a measured or sensed oxygen concentration of the oxygen 508 in the cleaning chamber 106 (e.g., the duration may be increased for higher oxygen concentrations or may be reduced for lower oxygen concentrations), and/or based on whether the cleaning chamber 106 was purged in a previous cleaning operation, among other examples. The controller may determine the measured or sensed oxygen concentration based on sensor data received from one or more oxygen sensors associated with the cleaning chamber 106.

In some implementations, the controller causes the inert gas 506 to be provided into the cleaning chamber 106 based on determining that the oxygen concentration in the cleaning chamber 106 is greater than a threshold oxygen concentration (e.g., 5% or another threshold oxygen concentration). In this way, the controller causes the inert gas 506 to be provided into the cleaning chamber 106 to reduce the oxygen concentration to equal to or below the threshold oxygen concentration. In some implementations, the controller causes the inert gas 506 to stop being provided into the cleaning chamber 106 based on determining that the oxygen concentration in the cleaning chamber 106 is equal to or below the threshold oxygen concentration. In some implementations, the controller causes the inert gas 506 to be provided into the cleaning chamber 106 based on receiving input (e.g., from an operator of the CMP tool 100).

In some implementations, the controller controls or adjusts (e.g., increases or decreases) the flow rate of the inert gas 506 into the cleaning chamber 106 to purge the oxygen 508 from the cleaning chamber 106 at a particular removal rate. For example, the controller may increase the flow rate to decrease the purge time or may decrease the flow rate to increase the purge time. In some implementations, the controller controls or adjusts (e.g., increases or decreases) the flow rate of the inert gas 506 into the cleaning chamber 106 based on a measured or sensed oxygen concentration of the oxygen 508 in the cleaning chamber 106. As an example, the controller may increase the flow rate of the inert gas 506 into the cleaning chamber 106 based on determining that the oxygen concentration in the cleaning chamber 106 is greater than a threshold oxygen concentration (e.g., 10% or another threshold oxygen concentration). As another example, the controller may decrease the flow rate of the inert gas 506 into the cleaning chamber 106 based on determining that the oxygen concentration in the cleaning chamber 106 is less than a threshold oxygen concentration. In some implementations, the controller controls or adjusts (e.g., increases or decreases) the flow rate of the inert gas 506 into the cleaning chamber 106 as a function of the measured or sensed oxygen concentration of the oxygen 508 in the cleaning chamber 106. In these implementations, the controller sets the flow rate of the inert gats 506 into the cleaning chamber 106 to a particular flow rate setting for a particular measured or sensed oxygen concentration.

Additionally and/or alternatively, the controller causes the quantity of nozzles (e.g., 312*a*, 312*b*, 314*a*, and/or 314*b*, among other examples) through which the inert gas 506 flows into the cleaning chamber 106 to be increased or decreased to purge the oxygen 508 from the cleaning chamber 106 at a particular removal rate. As an example, the controller causes the quantity of nozzles through which the inert gas 506 flows into the cleaning chamber 106 to be increased to increase the removal rate at which the oxygen 508 is purged from the cleaning chamber 106. As an example, the controller causes the quantity of nozzles through which the inert gas 506 flows into the cleaning chamber 106 to be decreased to decrease the removal rate at which the oxygen 508 is purged from the cleaning chamber 106.

Figure 5E:
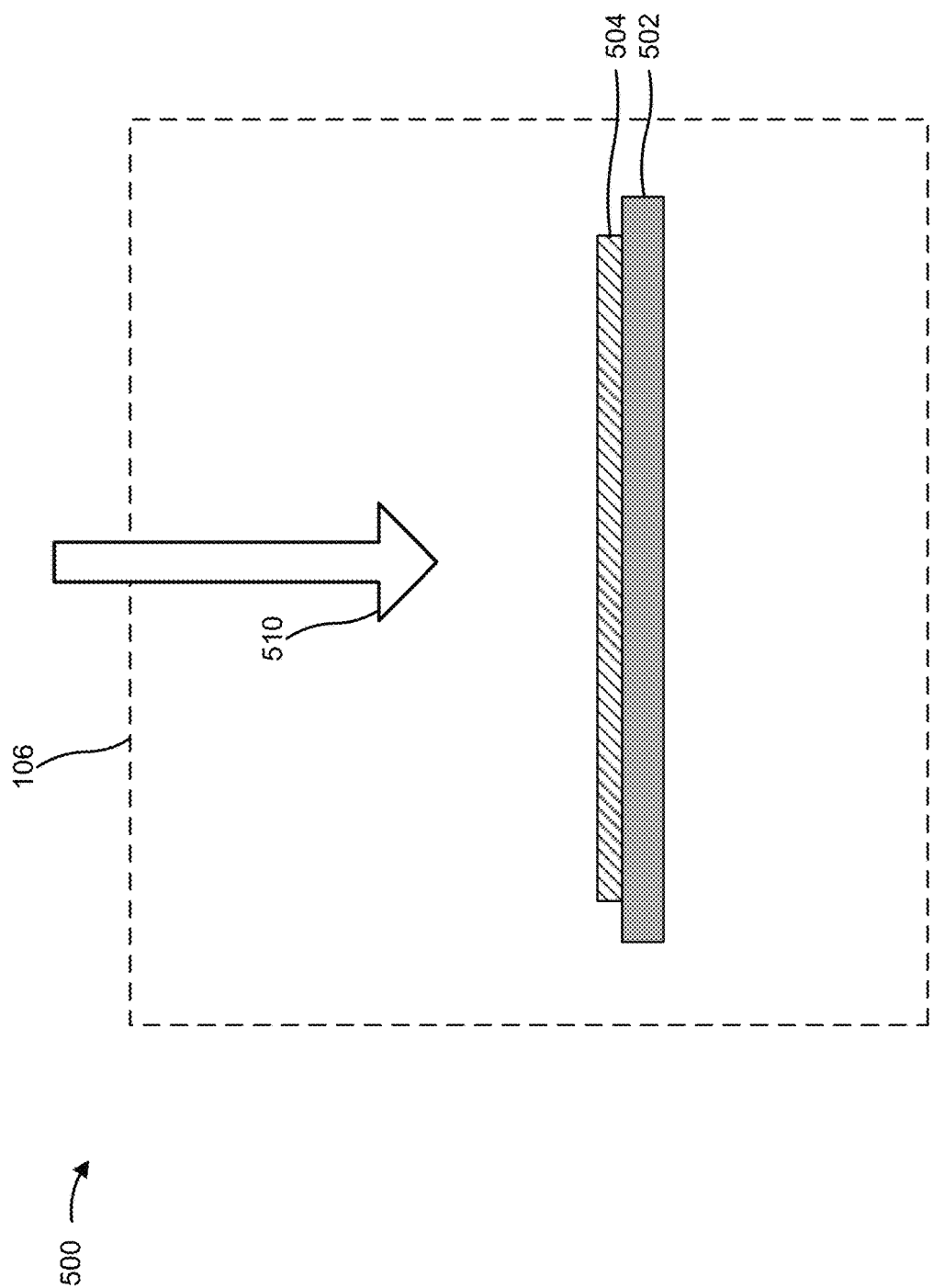

As shown in FIG. 5E, the semiconductor wafer 502 is cleaned using a cleaning agent 510 that is provided into the cleaning chamber 106 through a nozzle (e.g., the nozzle 310, the nozzle 412) in the cleaning chamber 106. The semiconductor wafer 502 is processed in a post-CMP cleaning operation in the cleaning chamber 106 while the oxygen concentration in the cleaning chamber 106 is maintained in a particular range. For example, the environment in the cleaning chamber 106 is controlled to include approximately 0% to approximately 10% oxygen so that the semiconductor wafer 502 may be cleaned in an oxygen-free (or near oxygen-free) environment in the cleaning chamber 106 to reduce and/or minimize the likelihood of oxidation of the one or more metallization layers 504.

In some implementations, the oxygen 508 is removed from the cleaning chamber 106 prior to the post-CMP cleaning operation. In these implementations, the semiconductor wafer 502 is processed in the post-CMP cleaning operation in the cleaning chamber 106 after removing the oxygen 508 from the cleaning chamber 106. In some implementations, controller causes the semiconductor wafer 502 to be processed in the post-CMP cleaning operation in the cleaning chamber 106 concurrently with removing the oxygen 508 from the cleaning chamber 106. In these implementations, the controller causes the inert gas 506 to flow into the cleaning chamber 106 while the cleaning agent 510 is provided into the cleaning chamber 106.

In some implementations, the semiconductor wafer 502 is rotated in the post-CMP cleaning operation on a wafer stage (e.g., by the wafer stage 306 or the wafer stage 406) to distribute the cleaning agent 510 and to permit various portions of the semiconductor wafer 502 to be cleaned. In some implementations, the semiconductor wafer 502 is mechanically cleaned in combination with being chemically cleaned using the cleaning agent 510. As an example, the semiconductor wafer 502 may be mechanically cleaned by the cleaning brush 308 or the cleaning pen 410 while the semiconductor wafer 502 is rotated on the wafer stage.

As indicated above, FIGS. 5A-5E are provided as an example. Other examples may differ from what is described with regard to FIGS. 5A-5E.

FIG. 6 is a diagram of example components of a device 600. In some implementations, the CMP tool 100 and/or a transport device 110 may include one or more devices 600 and/or one or more components of device 600. For example, the CMP tool 100 may include a device 600 (e.g., a controller and/or one or more sensors) associated with the cleaning chamber 106 to control various aspects of providing the inert gas 506 into the cleaning chamber 106 to remove the oxygen 508 from the cleaning chamber 106. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
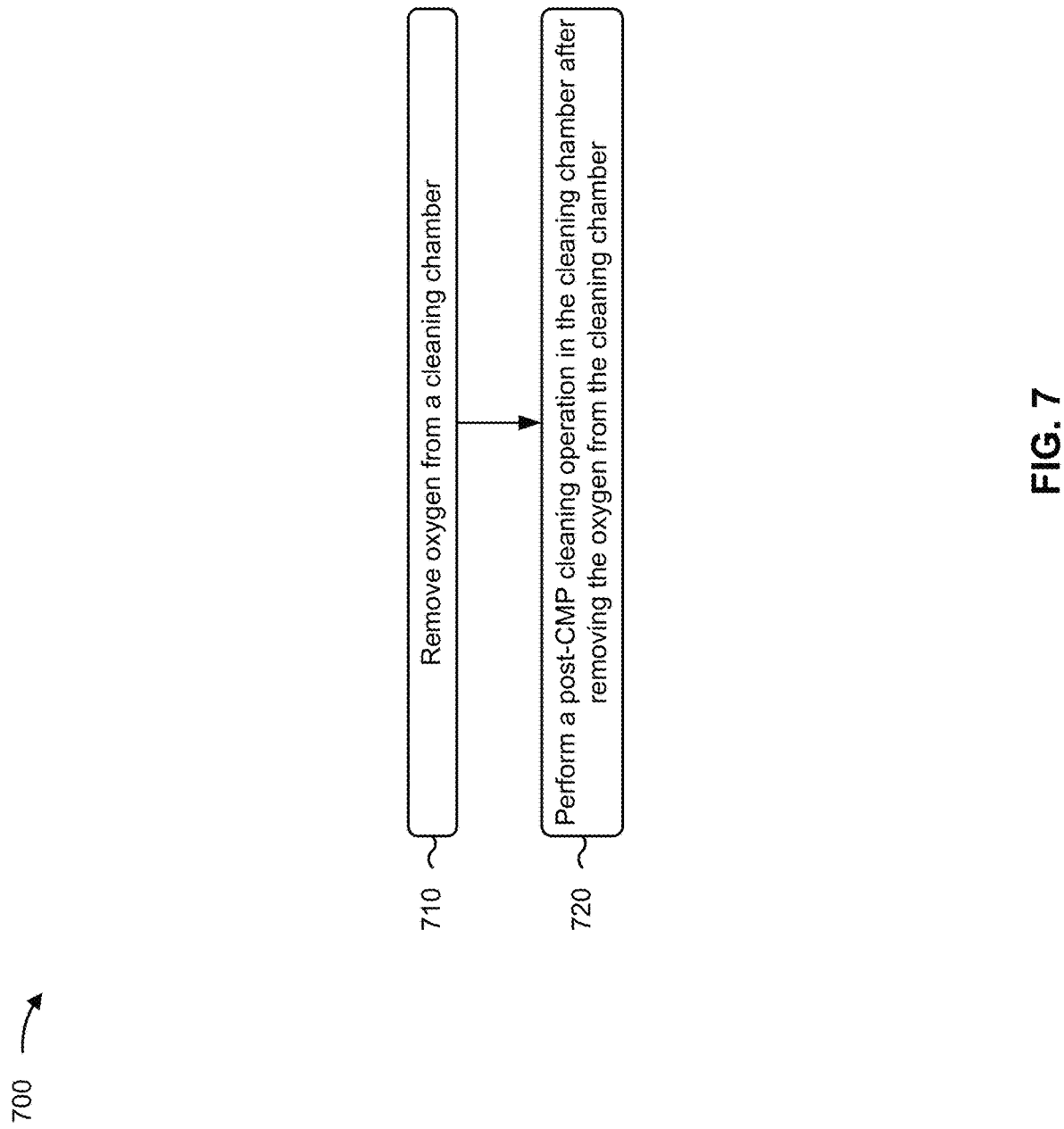
FIGS. 7 and 8 are flowcharts of example processes relating to post-chemical mechanical polishing/planarization (post-CMP) cleaning.

FIG. 7 is a flowchart of an example process 700 associated with post-CMP cleaning. In some implementations, one or more process blocks of FIG. 7 may be performed by a CMP tool (e.g., the CMP tool 100). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include removing oxygen from a cleaning chamber (block 710). For example, the CMP tool 100 may remove the oxygen 508 from a cleaning chamber (e.g., one or more of the cleaning chambers 106, 106a, 106b, and/or 106c), as described above.

As further shown in FIG. 7, process 700 may include performing a post-CMP cleaning operation in the cleaning chamber after removing the oxygen from the cleaning chamber (block 720). For example, the CMP tool 100 may perform a post-CMP cleaning operation in the cleaning chamber after removing the oxygen from the cleaning chamber, as described above.

Process 700 may include additional implementations, such as any single implementation or any combination of implementations described below and/or in connection with one or more other processes described elsewhere herein.

In a first implementation, removing the oxygen from the cleaning chamber includes providing an inert gas (e.g., the approximately horizontal flow 316a and/or 316b, the approximately vertical flow 318a and/or 318b, the inert gas 424, and/or the inert gas 506) into the cleaning chamber to remove the oxygen from the cleaning chamber. In a second implementation, alone or in combination with the first implementation, the inert gas includes at least one of argon (Ar), nitrogen (N2), or helium (He). In a third implementation, alone or in combination with one or more of the first and second implementations, providing the inert gas into the cleaning chamber includes providing the inert gas into the cleaning chamber through a plurality of nozzles (e.g., the nozzle 312a, 312b, 314a, and 314b) in the cleaning chamber.

In a fourth implementation, alone or in combination with one or more of the first through third implementations, providing the inert gas into the cleaning chamber includes providing the inert gas into the cleaning chamber through an inlet the 420b located on the nozzle 412 that is configured to dispense a cleaning agent (e.g., the cleaning agent 422 and/or 510) into the cleaning chamber. In a fifth implementation, alone or in combination with one or more of the first through fourth implementations, removing the oxygen from the cleaning chamber includes removing the oxygen from the cleaning chamber such that an oxygen concentration remaining in the cleaning chamber is in a range of approximately 0% to approximately 10%.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
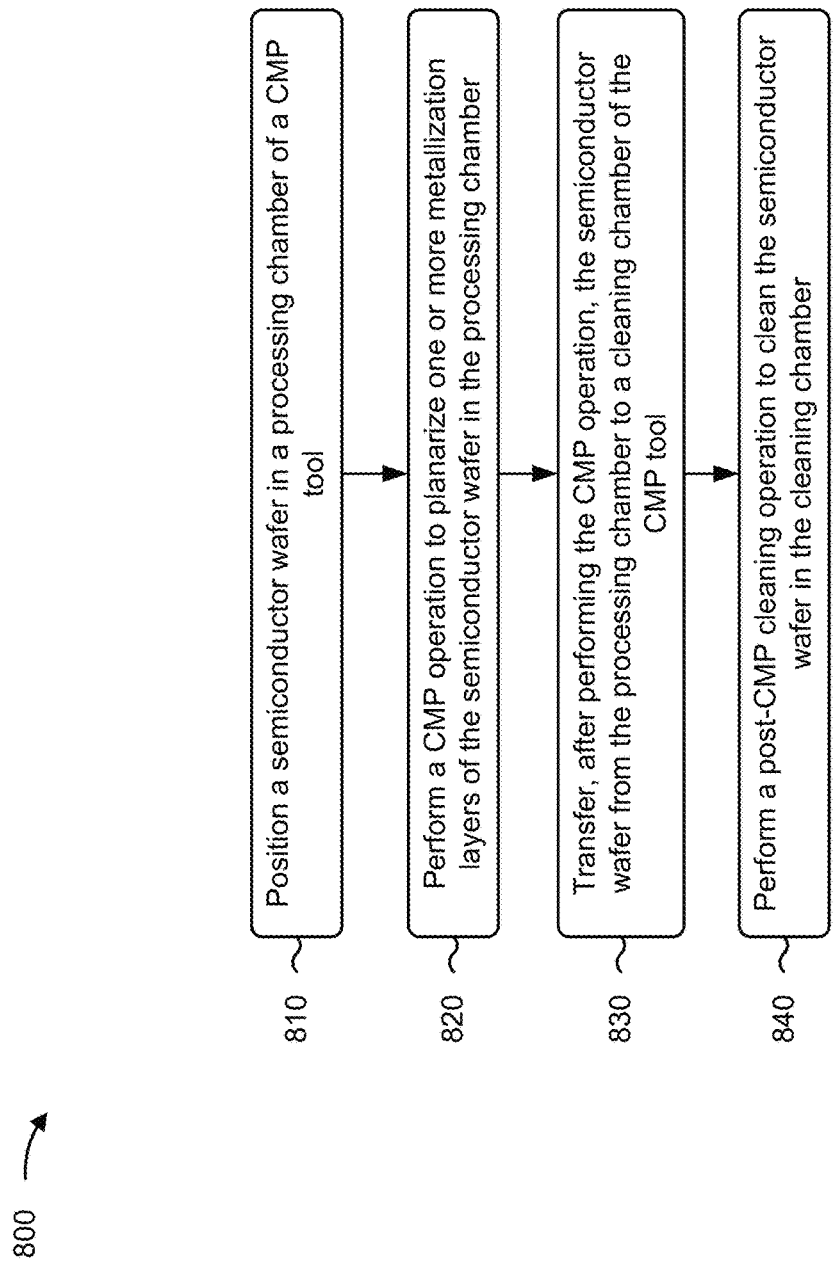

FIG. 8 is a flowchart of an example process 800 associated with post-CMP cleaning. In some implementations, one or more process blocks of FIG. 8 may be performed by a CMP tool (e.g., the CMP tool 100). Additionally, or alternatively, one or more process blocks of FIG. 8 may be performed by one or more components of device 600, such as processor 620, memory 630, storage component 640, input component 650, output component 660, and/or communication component 670.

As shown in FIG. 8, process 800 may include positioning a semiconductor wafer in a processing chamber of a CMP tool (block 810). For example, the CMP tool 100 (e.g., using a transport device 110 may position the semiconductor wafer 502 in a processing chamber 102 of the CMP tool 100, as described above.

As further shown in FIG. 8, process 800 may include performing a CMP operation to planarize one or more metallization layers of the semiconductor wafer in the processing chamber (block 820). For example, the CMP tool 100 (e.g., using the processing chamber 102) may perform a CMP operation to planarize the one or more metallization layers 504 of the semiconductor wafer 502 in the processing chamber 102, as described above.

As further shown in FIG. 8, process 800 may include transferring, after performing the CMP operation, the semiconductor wafer from the processing chamber to a cleaning chamber of the CMP tool (block 830). For example, the CMP tool 100 may transfer (e.g., using a transport device 110), after performing the CMP operation, the semiconductor wafer 502 from the processing chamber 102 to a cleaning chamber 106 of the CMP tool 100, as described above.

As further shown in FIG. 8, process 800 may include performing a post-CMP cleaning operation to clean the semiconductor wafer in the cleaning chamber (block 840). For example, the CMP tool 100 may perform (e.g., using the cleaning chamber 106) a post-CMP cleaning operation to clean the semiconductor wafer 502 in the cleaning chamber 106, as described above. In some implementations, an oxygen concentration in the cleaning chamber 106 is in a range of approximately 0% to approximately 10%.

Process 800 may include additional implementations, such as any single implementation or any combination of implementations described below and/or in connection with one or more other processes described elsewhere herein.

In a first implementation, process 800 includes providing an inert gas (e.g., the approximately horizontal flow 316a and/or 316b, the approximately vertical flow 318a and/or 318b, the inert gas 424, and/or the inert gas 506) into the cleaning chamber 106 to remove the oxygen 508 from the cleaning chamber 106 prior to the post-CMP cleaning operation. In a second implementation, alone or in combination with the first implementation, process 800 includes providing an inert gas (e.g., the approximately horizontal flow 316a and/or 316b, the approximately vertical flow 318a and/or 318b, the inert gas 424, and/or the inert gas 506) into the cleaning chamber 106 to remove the oxygen 508 from the cleaning chamber 106 during the post-CMP cleaning operation.

In a third implementation, alone or in combination with one or more of the first and second implementations, process 800 includes providing an inert gas (e.g., the approximately horizontal flow 316a and/or 316b, the approximately vertical flow 318a and/or 318b, the inert gas 424, and/or the inert gas 506) into the cleaning chamber 106 at a particular flow rate to remove the oxygen 508 from the cleaning chamber 106 to achieve the oxygen concentration in the range of approximately 0% to approximately 10% in the cleaning chamber 106. In a fourth implementation, alone or in combination with one or more of the first through third implementations, the inert gas includes at least one of argon (Ar), nitrogen (N2), or helium (He).

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a semiconductor processing tool includes a cleaning chamber configured to perform a post-CMP cleaning operation in an oxygen-free (or in a near oxygen-free) manner. An inert gas may be provided into the cleaning chamber to remove oxygen from the cleaning chamber such that the post-CMP cleaning operation may be performed in an oxygen-free (or in a near oxygen-free) environment. In this way, the post-CMP cleaning operation may be performed in an environment that reduces oxygen-causing corrosion of metallization layers and/or metallization structures on and/or in the semiconductor wafer, which may increase semiconductor processing yield, may decrease semiconductor processing defects, and/or may increase semiconductor processing quality, among other examples.

As described in greater detail above, some implementations described herein provide a method. The method includes removing oxygen from a cleaning chamber. The method includes performing a post-chemical mechanical polishing (post-CMP) cleaning operation in the cleaning chamber after removing the oxygen from the cleaning chamber.

As described in greater detail above, some implementations described herein provide a semiconductor processing tool. The semiconductor processing tool includes a chemical mechanical planarization (CMP) cleaning chamber in which a semiconductor wafer is to be processed during a cleaning operation. The semiconductor processing tool includes a nozzle configured to provide a cleaning agent into the CMP cleaning chamber during the cleaning operation. The semiconductor processing tool includes one or more gas inlets configured to provide an inert gas into the CMP cleaning chamber to remove oxygen from the CMP cleaning chamber.

As described in greater detail above, some implementations described herein provide a method. The method includes positioning a semiconductor wafer in a processing chamber of a chemical mechanical planarization (CMP) tool. The method includes performing a CMP operation to planarize one or more metallization layers of the semiconductor wafer in the processing chamber. The method includes transferring, after performing the CMP operation, the semiconductor wafer from the processing chamber to a cleaning chamber of the CMP tool. The method includes performing a post-CMP cleaning operation to clean the semiconductor wafer in the cleaning chamber, where an oxygen concentration in the cleaning chamber is in a range of approximately 0% to approximately 10%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    removing, via a vent, at a first wall of a cleaning chamber, and a plurality of nozzles of the cleaning chamber, oxygen from the cleaning chamber,
    wherein the plurality of nozzles comprises:
        a first nozzle at a second wall, of the cleaning chamber, intersecting with the first wall, and
        a second nozzle at a third wall, of the cleaning chamber, intersecting with the first wall and opposite from the first side second wall; and
    performing a post-chemical mechanical polishing/planarization (post-CMP) cleaning operation in the cleaning chamber after removing the oxygen from the cleaning chamber.

2. The method of claim 1, wherein removing the oxygen from the cleaning chamber comprises:
    providing an inert gas into the cleaning chamber to remove the oxygen from the cleaning chamber.

3. The method of claim 2, wherein providing the inert gas into the cleaning chamber comprises:
    providing the inert gas into the cleaning chamber through the plurality of nozzles in the cleaning chamber.

4. The method of claim 2, wherein providing the inert gas into the cleaning chamber comprises:
    providing the inert gas into the cleaning chamber through an inlet located on a nozzle, of the plurality of nozzles, that is configured to dispense a cleaning agent into the cleaning chamber.

5. A semiconductor processing tool, comprising:
    a chemical mechanical polishing/planarization (CMP) cleaning chamber in which a semiconductor wafer is to be processed during a cleaning operation;
    a first nozzle, at a first wall of the CMP cleaning chamber, configured to provide a cleaning agent into the CMP cleaning chamber during the cleaning operation; and
    a plurality of second nozzles configured to provide an inert gas into the CMP cleaning chamber to remove oxygen from the CMP cleaning chamber,
        wherein the plurality of second nozzles comprises:
            a first subset of second nozzles at a second wall, of the CMP cleaning chamber, intersecting with the first wall, and
            a second subset of second nozzles at a third wall, of the CMP cleaning chamber, intersecting with the first wall opposite from the first side second wall, and a vent, at a fourth wall of the CMP cleaning chamber, configured to remove the oxygen from the CMP cleaning chamber,
wherein the fourth wall intersects with the first wall, the second wall, and third wall.

6. The semiconductor processing tool of claim 5, wherein the plurality of second nozzles, to provide the inert gas into the CMP cleaning chamber to remove the oxygen from the CMP cleaning chamber, are configured to:
provide an amount of the inert gas into the CMP cleaning chamber to remove approximately 90% to approximately 100% of oxygen in the CMP cleaning chamber.

7. The semiconductor processing tool of claim 5, wherein the first subset of second nozzles are configured to provide the inert gas at a first angle in the CMP cleaning chamber, and the second subset of second nozzles are configured to provide the inert gas at a second angle, different from the first angle, in the CMP cleaning chamber.

8. The semiconductor processing tool of claim 7, wherein the first angle provides an approximately downward flow in the CMP cleaning chamber and the second angle provides an approximately horizontal flow in the CMP cleaning chamber.

9. The semiconductor processing tool of claim 5, wherein the plurality of second nozzles are located at a top of the CMP cleaning chamber; and
wherein the vent is located at a bottom of the CMP cleaning chamber.

10. The semiconductor processing tool of claim 5, wherein the plurality of second nozzles are located at a bottom of the CMP cleaning chamber; and
wherein the vent that is located at a top of the CMP cleaning chamber.

11. The semiconductor processing tool of claim 5, further comprising:
a cleaning device, included in the cleaning chamber, configured to physically clean the semiconductor wafer during the cleaning operation.

12. The semiconductor processing tool of claim 11, wherein the cleaning device comprises at least one of:
a cleaning pen, or
a cleaning brush.

13. A method, comprising:
positioning a semiconductor wafer in a processing chamber of a chemical mechanical polishing/planarization (CMP) tool;
performing a CMP operation to planarize one or more metallization layers of the semiconductor wafer in the processing chamber;
transferring, after performing the CMP operation, the semiconductor wafer from the processing chamber to a cleaning chamber of the CMP tool; and
removing, via a vent, at a first wall of a cleaning chamber, and a plurality of nozzles, of the cleaning chamber, oxygen from the cleaning chamber, wherein the plurality of nozzles comprises:
a first nozzle at a second wall, of the cleaning chamber, intersecting with the first wall and
a second nozzle at a third wall, of the cleaning chamber, intersecting with the first wall and opposite from the second wall.

14. The method of claim 13, wherein the oxygen is removed from the cleaning chamber prior to a post-CMP cleaning operation associated with cleaning the semiconductor wafer in the cleaning chamber.

15. The method of claim 13, wherein the oxygen is removed from the cleaning chamber during a post-CMP cleaning operation associated with cleaning the semiconductor wafer in the cleaning chamber.

16. The method of claim 13, wherein the oxygen is removed from the cleaning chamber such that an oxygen concentration in the cleaning chamber is in a range of approximately 0% to approximately 10% in the cleaning chamber.

17. The method of claim 16, wherein the oxygen is removed via an inert gas comprising at least one of:
argon (Ar),
nitrogen (N2), or
helium (He).

18. The semiconductor processing tool of claim 12, wherein the cleaning device comprising the cleaning brush,
wherein the cleaning brush is configured to rotate against the semiconductor wafer in the cleaning chamber, and
wherein the cleaning brush extends between the first wall and a fourth wall of the cleaning chamber, wherein the fourth wall of the cleaning chamber each between is opposite from the third wall.

19. The method of claim 1, wherein the plurality of nozzles further comprises a third nozzle at the second wall or the third wall, wherein the third nozzle is configured to provide an inert gas into the cleaning chamber at an angle different from the first nozzle or the second nozzle.

20. The semiconductor processing tool of claim 5, wherein the plurality of second nozzles further comprises a third subset of second nozzles at the second wall or the third wall, wherein the third subset of second nozzles is configured to provide an inert gas into the cleaning chamber at an angle different from the first subset of second nozzles or the second subset of second nozzles.

* * * * *

UNITED STATES PATENT AND TRADEMARK OFFICE
CERTIFICATE OF CORRECTION

PATENT NO. : 12,068,169 B2
APPLICATION NO. : 17/446248
DATED : August 20, 2024
INVENTOR(S) : Ji Cui et al.

It is certified that error appears in the above-identified patent and that said Letters Patent is hereby corrected as shown below:

In the Claims

Claim 1:
Column 14, Line 31, change "site from the first side second wall;" to -- site from the second wall; --

Claim 5:
Column 14, Line 66, change "first wall opposite from the first side second wall," to -- first wall opposite from the second wall, --

Claim 18:
Column 16, Lines 35-37, change "and a fourth wall of the cleaning chamber, wherein the fourth wall of the cleaning chamber each between is opposite from the third wall." to -- and a fourth wall of the cleaning chamber. --

Signed and Sealed this
Eighth Day of October, 2024

Katherine Kelly Vidal
*Director of the United States Patent and Trademark Office*